United States Patent
Ok et al.

(10) Patent No.: US 9,685,340 B2
(45) Date of Patent: Jun. 20, 2017

(54) STABLE CONTACT ON ONE-SIDED GATE TIE-DOWN STRUCTURE

(71) Applicant: International Business Machines Corporation, Armonk, NY (US)

(72) Inventors: Injo Ok, Loudonville, NY (US); Balasubramanian Pranatharthiharan, Watervliet, NY (US); Soon-Cheon Seo, Glenmont, NY (US); Charan Veera Venkata Satya Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/753,827

(22) Filed: Jun. 29, 2015

(65) Prior Publication Data

US 2016/0379925 A1    Dec. 29, 2016

(51) Int. Cl.
  *H01L 23/528* (2006.01)
  *H01L 21/768* (2006.01)
  *H01L 21/283* (2006.01)
  *H01L 29/78* (2006.01)
  *H01L 23/485* (2006.01)

(52) U.S. Cl.
  CPC ...... *H01L 21/283* (2013.01); *H01L 21/76802* (2013.01); *H01L 21/76877* (2013.01); *H01L 23/485* (2013.01); *H01L 29/78* (2013.01)

(58) Field of Classification Search
  CPC ............. H01L 23/528; H01L 21/76802; H01L 21/283; H01L 21/78
  See application file for complete search history.

(56) References Cited

U.S. PATENT DOCUMENTS

| 2013/0193489 A1 | 8/2013 | Baars et al. |
| 2013/0320452 A1* | 12/2013 | Wann .............. H01L 21/823425 257/368 |

* cited by examiner

*Primary Examiner* — Seahvosh Nikmanesh
(74) *Attorney, Agent, or Firm* — Scully, Scott, Murphy & Presser, P.C.; Steven J. Meyers

(57) ABSTRACT

After forming a first contact opening to expose a portion of a first source/drain contact located at one side of a functional gate structure followed by forming a second contact opening that intersects the first contact opening to expose the functional gate structure and a portion of a second source/drain contact located at an opposite side of the functional gate structure, the exposed portions of the first source/drain contact and the second-side source/drain contact are recessed. A dielectric cap is subsequently formed over the recessed portion of the second source/drain contact. A shared contact is formed in the first contact opening and the second contact opening to electrically connect a gate conductor of the functional gate structure to the first source/drain contact. The dielectric cap isolates the second source/drain contact from the shared contact, thus preventing contact shorts in a one-sided gate tie-down structure for 7 nm node and beyond.

17 Claims, 10 Drawing Sheets

STABLE CONTACT ON ONE-SIDED GATE TIE-DOWN STRUCTURE

BACKGROUND

The present application relates to semiconductor device fabrication, and more particularly, to methods and structures for preventing contact shorts in a one-sided gate tie-down structure.

An integrated circuit fabricated on a semiconductor substrate typically requires metal interconnects for electrically interconnecting discrete semiconductor devices on the semiconductor substrate. At 7 nm node, a one-sided gate tie-down structure having a shared contact may be employed to electrically connect a gate conductor of a gate structure to a source/drain contact located at one side of the gate structure (i.e., target source/drain contact). However, as the transistor dimensions shrink, it is increasingly difficult to maintain precise overlay tolerance, with the result that even small misalignments of the masks in the formation of contact openings within which the shared contact forms will result in the exposure of a small portion or "border" of another source/drain contact located at an opposite side of the gate structure. As a result, the shared contact may connect not only the gate conductor and the target source/drain contact, but also the undesired another source/drain contact, causing contact shorts. Therefore, there remains a need for a structure that can effectively prevent electrical shorts a one-sided gate tie-down structure for 7 nm node and beyond.

SUMMARY

The present application provides a structure that can effectively prevent electrical shorts between a shared contact that electrically connects a functional gate structure and a source/drain contact located at one side of the functional gate structure and another source/drain contact located at an opposite side of the functional gate structure in a one-sided gate tie-down structure for 7 nm node and beyond. After forming a first contact opening to expose a portion of a first source/drain contact located at one side of a functional gate structure followed by forming a second contact opening that intersects the first contact opening to expose the functional gate structure and a portion of a second source/drain contact located at an opposite side of the functional gate structure, the exposed portions of the first source/drain contact and the second source/drain contact are recessed. A dielectric cap is subsequently formed over the recessed portion of the second source/drain contact. A shared contact is formed in the first contact opening and the second contact opening to electrically connect a gate conductor of the functional gate structure to the first source/drain contact. The dielectric cap isolates the second source/drain contact from the shared contact, thus preventing contact shorts in the one-sided gate tie-down structure for 7 nm node and beyond.

In one aspect of the present application, a semiconductor structure is provided. The semiconductor structure includes a functional gate structure located over a semiconductor material layer and laterally surrounded by an interlevel dielectric (ILD) layer, a first source/drain region located at a first side of the functional gate structure and a second source/drain region located at a second side of the functional gate structure opposite the first side, a first source/drain contact and a second source/drain contact embedded within the ILD layer. The first source/drain contact contacts a portion of the first source/drain region and has a recessed portion proximal to the first side of the functional gate structure, while the second source/drain contact contacts a portion of the second source/drain region and has a recessed portion proximal to the second side of the functional gate structure. The semiconductor structure further includes a shared contact electrically connecting a gate conductor of the functional gate structure to the first source/drain contact, and a dielectric cap present over the recessed portion of the second source/drain contact, the dielectric cap isolating the second source/drain contact from the shared contact.

In another aspect of the present application, a method of forming a semiconductor structure is provided. In one embodiment, the method includes first forming a first source/drain contact and a second source/drain contact embedded in an interlevel dielectric (ILD) layer that laterally surrounds a functional gate structure. The first source/drain contact vertically contacts a first source/drain region located at a first side of the functional gate structure, while the second source/drain contact vertically contacts a second source/drain region located at a second side of the functional gate structure opposite the first side. A contact level dielectric layer is then formed over the ILD layer, the functional gate structure, the first source/drain contact and the second source/drain contact. After forming a first contact opening through the contact level dielectric layer to expose a portion of the first source/drain contact followed by forming a second contact intersecting the first contact opening through the contact level dielectric layer to expose the functional gate structure and portions of the first source/drain contact and the second source/drain contact that are adjoined to the functional gate structure, portions of the first source/drain contact and the second source/drain contact that are exposed by the first contact opening and the second contact opening are recessed to provide a first void over a recessed portion of the first source/drain contact and a second void over a recessed portion of the second source/drain contact. Next, a gate cap is removed from the functional gate structure to expose a gate conductor of the functional gate structure. After forming a dielectric cap over the recessed portion of the second source/drain contact to completely fill the second void, a shared contact is formed in the first contact opening, the second contact opening and the first void.

In another embodiment, the method includes firm forming a first source/drain contact and a second source/drain contact embedded in an interlevel dielectric (ILD) layer that laterally surrounds a functional gate structure. The first source/drain contact vertically contacts a first source/drain region located at a first side of the functional gate structure, while the second source/drain contact vertically contacts a second source/drain region located at a second side of the functional gate structure opposite the first side. Next, a contact level dielectric layer is formed over the ILD layer, the functional gate structure, the first source/drain contact and the second source/drain contact. After forming a first contact opening through the contact level dielectric layer to expose a portion of the first source/drain contact followed by forming a second contact opening intersecting the first contact opening through the contact level dielectric layer to expose the functional gate structure and portions of the first source/drain contact and the second source/drain contact that are adjoined to the functional gate structure, portions of the first source/drain contact and the second source/drain contact exposed by the second contact opening are recessed to provide a first void over a recessed portion of the first source/drain contact and a second void over a recessed portion of the second source/drain contact. Next, a gate cap is removed from the functional gate structure to expose a gate conductor of the functional gate structure. After forming dielectric caps over the recessed portion of the first source/drain contact and the recessed portion of the second source/drain contact to completely fill the first void and the second void, a shared contact is formed in the first contact opening and the second contact opening.

DETAILED DESCRIPTION

Figure 1:
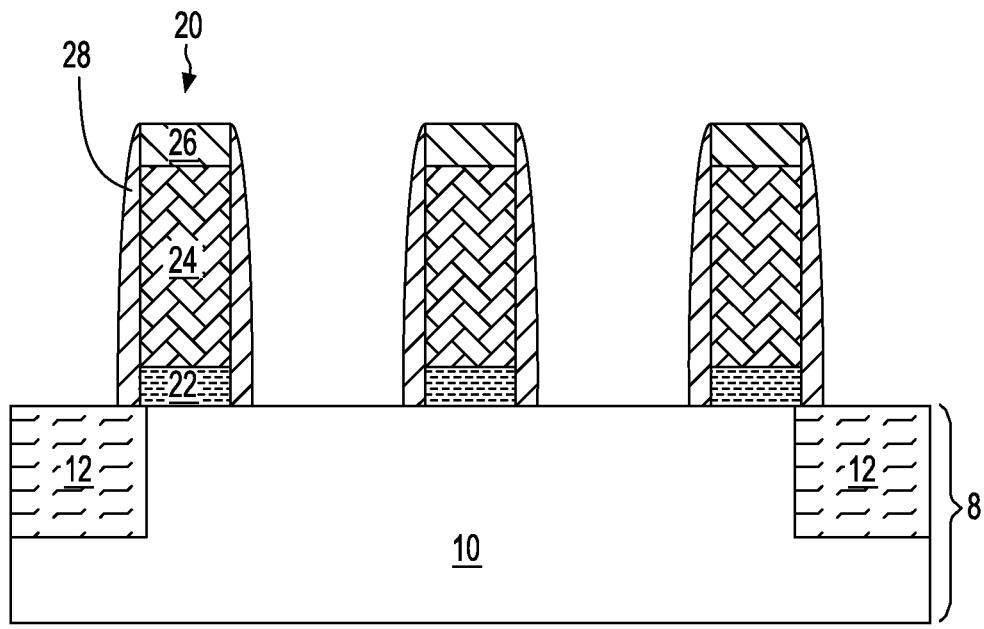
FIG. 1 is a cross-sectional view of a first exemplary semiconductor structure including a semiconductor material layer and sacrificial gate structures formed thereon according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Although the following description and drawings illustrate the basic processing steps employed to form structures for preventing contact shorts in a one-sided gate tie-down structure in planar FETs, the basic concept of the present application can be applied to form structures for preventing contact shorts in a one-sided gate tie-down structure in non-planar devices such as FinFETs and nanowire FETs as well.

Referring to FIG. 1, a first exemplary semiconductor structure according to a first embodiment of the present application includes a substrate 8 and sacrificial gate structures 20 formed thereupon. The substrate 8 can be a semiconductor-on-insulator (SOI) substrate or a bulk semiconductor substrate. The substrate 8 includes a semiconductor material layer 10, which can be a top semiconductor layer of a semiconductor-on-insulator (SOI) substrate or an upper portion of a bulk semiconductor substrate. Various doped wells (not shown) having p-type or n-type dopants can be formed in the semiconductor material layer 10. Shallow trench isolation (STI) structures 12 including a dielectric material can be formed in the substrate 8 to provide electrical isolation between neighboring semiconductor devices to be formed.

The sacrificial gate structures 20 are arranged in parallel with respect to each other. In one embodiment, each sacrificial gate structure 20 includes a sacrificial gate stack of, from bottom to top, a sacrificial gate dielectric 22, a sacrificial gate conductor 24 and a sacrificial gate cap 26, and a gate spacer 28 present on each sidewall of the sacrificial gate stacks (22, 24, 26). In other embodiments, the sacrificial gate dielectric 22 and/or the sacrificial gate cap 26 can be omitted. The sacrificial gate stacks (22, 24, 26) may have a gate pitch of 44 nm. The gate pitch is defined as the distance from the center of one gate stack to the center of an adjacent gate stack.

The sacrificial gate stack (22, 24, 26) can be formed by first providing a material stack (not shown) that includes, from bottom to top, a sacrificial gate dielectric layer, a sacrificial gate conductor layer and a sacrificial gate cap layer over the semiconductor material layer 10. In some embodiments of the present application and as mentioned above, the sacrificial gate dielectric layer can be omitted. When present, the sacrificial gate dielectric layer includes a dielectric material such as an oxide or a nitride. In one embodiment, the sacrificial gate dielectric layer can be a layer of silicon oxide, silicon nitride, or silicon oxynitride. The sacrificial gate dielectric layer can be formed by a conventional deposition process, including but not limited to, chemical vapor deposition (CVD) or physical vapor deposition (PVD). The sacrificial gate dielectric layer can also be formed by conversion of a surface portion of the semiconductor material layer 10. The sacrificial gate dielectric layer that is formed may have a thickness from 1 nm to 10 nm, although lesser and greater thicknesses can also be employed.

The sacrificial gate conductor layer can include a semiconductor material such as polysilicon or a silicon-containing semiconductor alloy such as a silicon-germanium alloy. The sacrificial gate conductor layer can be formed using CVD or plasma enhanced chemical vapor deposition (PECVD). The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD and PECVD. The sacrificial gate cap layer that is formed may have a thickness from 10 nm to 200 nm, although lesser and greater thicknesses can also be employed.

The material stack can then be patterned by lithography and etching to form the sacrificial gate stacks (22, 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as a reactive ion etch (RIE) process. The remaining portions of the material stack after the pattern transfer constitute the sacrificial gate stacks (22, 24, 26). The remaining portions of the photoresist layer may be subsequently removed by, for example, ashing.

The gate spacer 28 may include a dielectric material such as, for example, an oxide, a nitride, an oxynitride, or any combination thereof. For example, the gate spacer 28 may be composed of silicon nitride, silicon boron carbon nitride (SiBCN), or silicon carbon oxynitride (SiOCN). The gate spacer 28 can be formed by first providing a conformal gate spacer material layer (not shown) on exposed surfaces of the sacrificial gate stacks (22, 24, 26) and the semiconductor material layer 10 and then etching the conformal gate spacer material layer to remove horizontal portions of the conformal gate spacer material layer. The conformal gate spacer material layer can be provided by a deposition process including, for example, CVD, PECVD, or PVD. The etching of the conformal gate spacer material layer may be performed by a dry etch process such as, for example, RIE. The remaining portions of the conformal gate spacer material layer constitute the gate spacer(s) 28. The width of each gate spacer 28, as measured at the base of the gate spacer 28 can be from 5 nm to 100 nm, although lesser and greater widths can also be employed.

Figure 2:
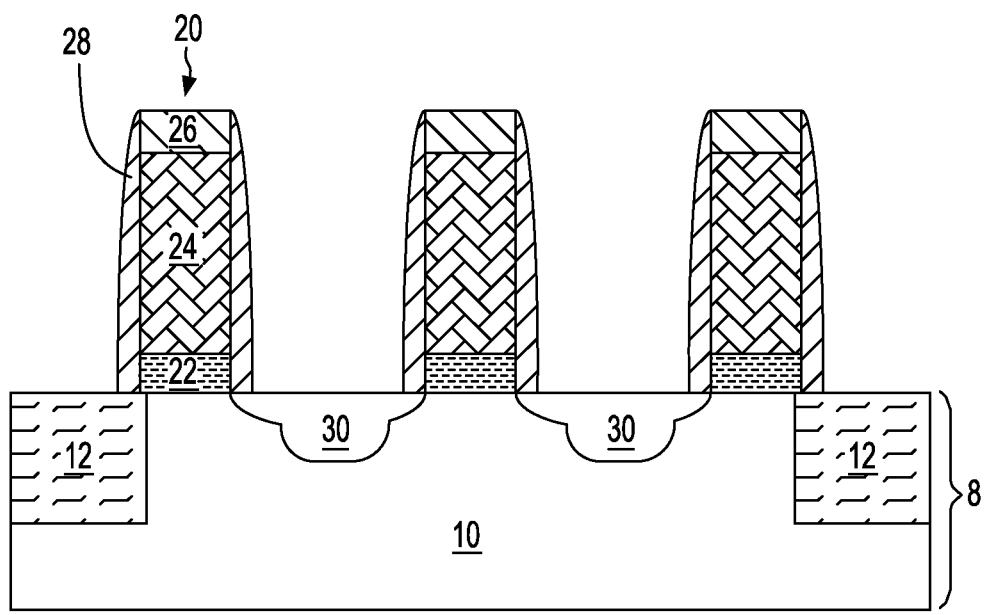
FIG. 2 is a cross-sectional view of the first exemplary semiconductor structure of FIG. 1 after forming source/drain regions between the sacrificial gate structures.

Referring to FIG. 2, a source region and a drain region (collectively referred to as source/drain regions 30) are formed on opposite sides of each sacrificial gate structure 20. In one embodiment and as shown in FIG. 2, the source/drain regions 30 are planar source/drain region formed in the semiconductor material layer 10. A source/drain implantation is performed to form source/drain regions 30 in portions of the semiconductor material layer 10 on opposite sides of the sacrificial gate structures 20 using the sacrificial gate structures 20 as an implantation mask. Each of the remaining portions of the semiconductor material layer 10 that is located beneath a corresponding sacrificial gate structure 20 constitutes a channel region of a FET. The source/drain regions 30 can be formed by implanting dopants of the opposite conductivity type than the conductivity type of the semiconductor material layer 10 using, for example, an ion implantation process, plasma doping, gas phase diffusion, or diffusion from a doped oxide. For n-type FETs, the source/drain regions 30 can be made by implanting an n-type dopant, while for p-type FETs, the source/drain regions 30 can be made by implanting a p-type dopant. Exemplary n-type dopants include, but are not limited to, P, As or Sb. Exemplary p-type dopants include, but are not limited to, B, Al, Ga or In. An activation anneal can be subsequently performed to activate the implanted dopants in the source/drain regions 30.

In another embodiment, the source/drain regions 30 are raised source/drain regions (not shown) formed on the portions of semiconductor material layer 10 on opposite sides of the sacrificial gate structures 20. Raised source/drain region may be formed by selective epitaxy. During the selective epitaxy process, the deposited semiconductor material grows only on exposed semiconductor regions, i.e., portions of semiconductor material layer 10 on opposite sides of the sacrificial gate structures 20 and does not grow on dielectric surfaces, such as surfaces of the sacrificial gate caps 26, the gate spacers 28 and the STI regions 12.

The semiconductor material (i.e., silicon-containing semiconductor material and germanium-containing semiconductor material) of the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material.

Figure 3:
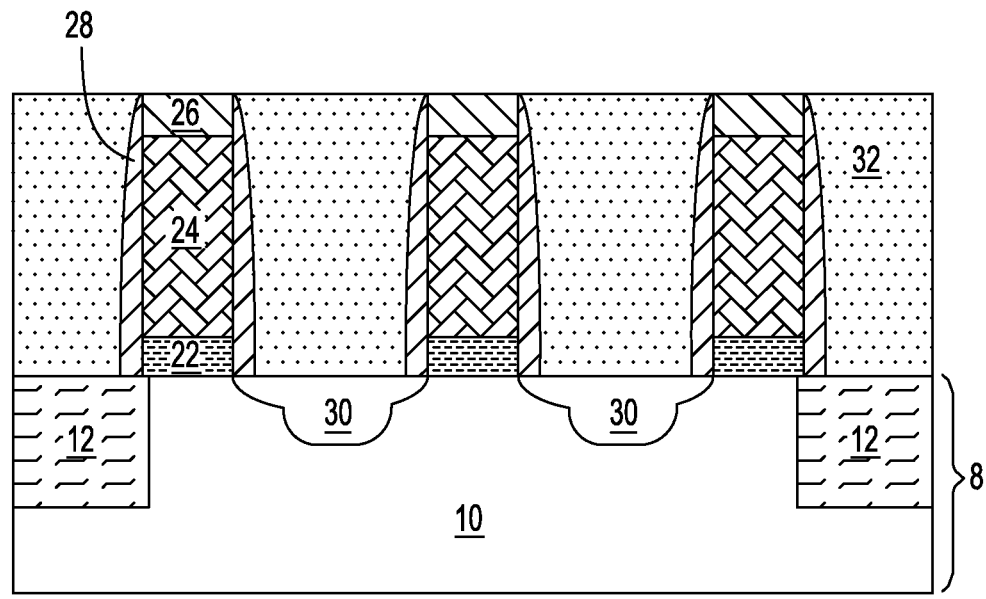
FIG. 3 is a cross-sectional view of the first exemplary semiconductor structure of FIG. 2 after forming an interlevel dielectric (ILD) layer laterally surrounding the sacrificial gate structures and overlying the source/drain regions.

Referring to FIG. 3, an interlevel dielectric (ILD) layer 32 is formed over the source/drain regions 30 and the STI regions 12 and laterally surrounds the sacrificial gate structures 20. In some embodiments of the present application, the ILD layer 32 is composed of a dielectric material that can be easily planarized. For example, the ILD layer 32 can include a doped silicate glass, an undoped silicate glass (silicon oxide), an organosilicate glass (OSG), a porous dielectric material, or amorphous carbon. The ILD layer 32 can be deposited using a conventional deposition process, such as, for example, CVD, PECVD, sputter deposition, reactive sputter deposition, ion-beam deposition, and evaporation. Following the deposition of the ILD layer 32, the ILD layer 32 can be subsequently planarized, for example, by CMP using topmost surfaces of the sacrificial gate structures 20 (i.e., top surfaces of the sacrificial gate caps 26) as an etch stop so that a top surface of the ILD layer 32 is coplanar with topmost surfaces of the sacrificial gate structures 20.

Figure 4:
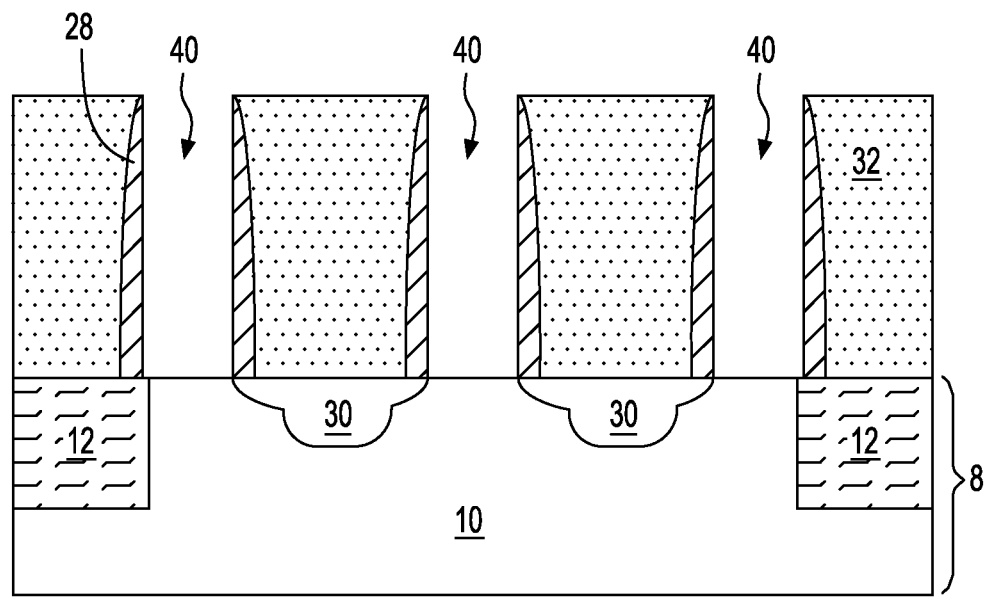
FIG. 4 is a cross-sectional view of the first exemplary semiconductor structure of FIG. 3 after removing sacrificial gate stacks in the sacrificial gate structures to provide gate cavities.

Referring to FIG. 4, the sacrificial gate stacks (22, 24, 26) are removed to provide gate cavities 40. The sacrificial gate stacks (22, 24, 26) can be removed selectively to the semiconductor material layer 10, the STI regions 12, the gate spacers 28 and the ILD layer 32 using at least one etch. The at least on etch can be a wet chemical etch such as an ammonia etch or a dry etch such as RIE. A gate cavity 40 is thus formed within a volume from which each sacrificial gate stacks (22, 24, 26) is removed and is laterally confined by inner sidewalls of the gate spacers 28.

Figure 5:
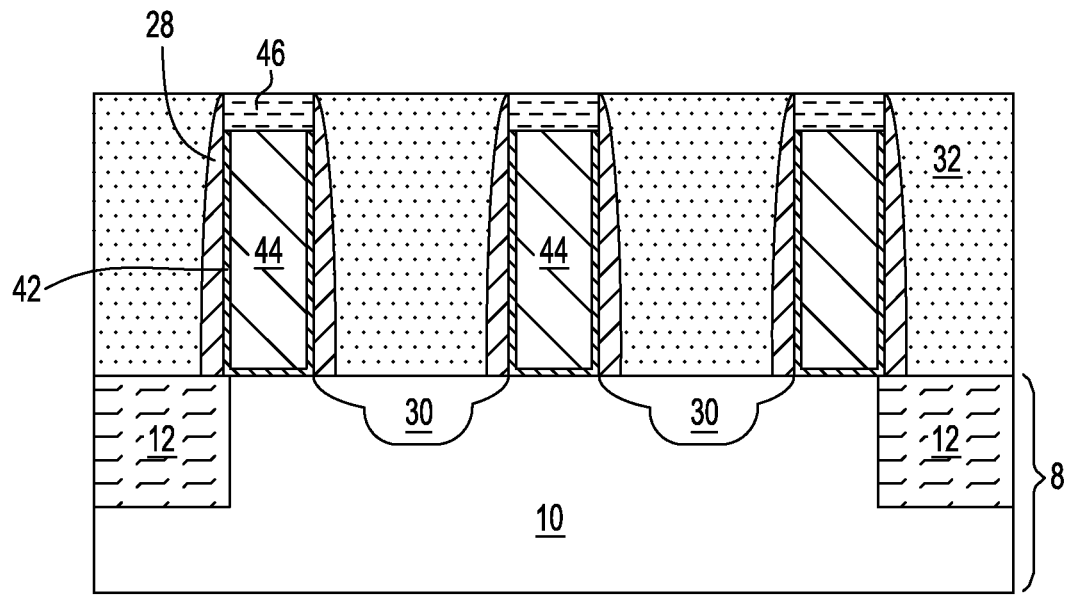
FIG. 5 is a cross-sectional view of the first exemplary semiconductor structure of FIG. 4 after forming functional gate structures by depositing functional gate stacks in the gate cavities.

Referring to FIG. 5, functional gate stacks are formed in the gate cavities 40 and are laterally surrounded by the gate spacers 28. Each functional gate stack includes, from bottom to top, a gate dielectric 42, a gate conductor 44 and a gate cap 46. Each functional gate stack (42, 44, 46) and gate spacers 28 present on opposite sidewalls of each functional gate stack constitute a functional gate structure.

The functional gate stacks (42, 44, 46) can be formed by first depositing a conformal gate dielectric layer (not shown) on bottom surfaces and sidewalls of the gate cavities 40 and the top surface of the ILD layer 32. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric layer includes $HfO_2$. The gate dielectric layer can be formed by a conventional deposition process including, but not limited to, CVD, PVD, atomic layer deposition (ALD), molecular beam epitaxy (MBE), ion beam deposition, electron beam deposition, and laser assisted deposition. The gate dielectric layer that is formed may have a thickness ranging from 0.9 nm to 6 nm, although lesser and greater thicknesses can also be employed. The gate dielectric layer may have an effective oxide thickness on the order of or less than 1 nm.

Remaining volumes of the gate cavities 40 are then filled with a gate conductor layer (not shown). The gate conductor layer can include any conductive material which may be a doped semiconductor material or a metallic material, such as, for example, tungsten, titanium, tantalum, aluminum, nickel, ruthenium, palladium and platinum. In one embodiment, the gate conductor layer is comprised of tungsten.

The gate conductor layer can be formed utilizing a conventional deposition process including, for example, CVD, PECVD, PVD, sputtering, chemical solution deposition and ALD. When silicon-containing materials are used as the gate conductor layer, the silicon-containing materials can be doped with an appropriate impurity by utilizing either an in-situ doping deposition process or by utilizing deposition, followed by a step such as ion implantation or gas phase doping in which the appropriate impurity is introduced into the silicon-containing material.

In some embodiment of the present application, prior to the formation of the gate conductor layer, a work function metal layer (not shown) may be conformally deposited over the gate dielectric layer employing CVD, sputtering or plating. The work function metal layer includes a metal having a work function suitable to tune the work function of FETs subsequently formed. The thickness of the work function metal layer can be from 3 nm to 15 nm, although lesser and greater thicknesses can also be employed.

The portion of the gate conductor layer formed above the top surface of the ILD layer 32 can be removed, for example, by CMP. The portion of the gate dielectric layer that is formed above the top surface of the ILD layer 32 may also be subsequently removed. In some embodiments and as illustrated, the remaining portions of the gate conductor layer and the remaining portions of the gate dielectric layer may be recessed utilizing a dry etch or a wet chemical etch to provide a void (not shown) in each of the gate cavities 40. The recessed portions of the gate conductor layer constitute gate conductors 44, and the recessed portions of the gate dielectric layer constitute gate dielectrics 42.

A gate cap material is then deposited over the gate dielectric 42 and the gate conductor 44 in each gate cavity 40 and planarized to fill voids that are formed after recessing the remaining portions of the gate conductor layer and the remaining portions of the gate dielectric layer. Exemplary gate cap materials include, but are not limited to, silicon nitride, silicon carbide nitride (SiCN), or silicon boron carbonitride (SiBCN). The deposition of the gate cap material can be performed utilizing a conventional deposition process such as, for example, CVD or PECVD. Following the deposition of the gate cap material, the deposited gate cap material can be subsequently planarized, for example, by CMP using the top surface of the ILD layer 32 as an etch stop to provide the gate caps 46. The top surface of each gate cap 46 can be coplanar with the top surface of the ILD layer 32.

Figure 6:
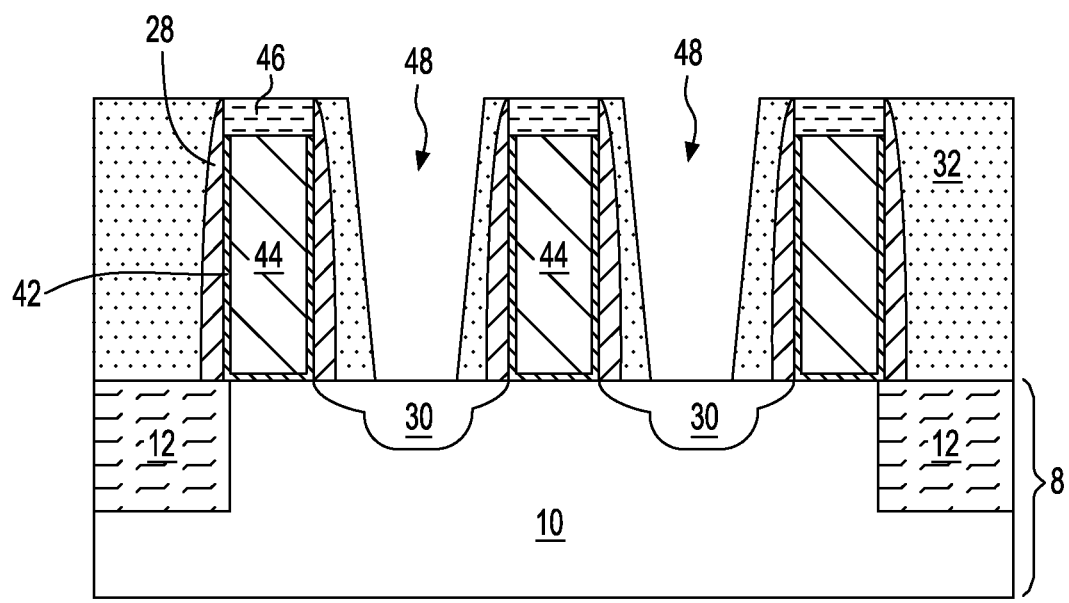
FIG. 6 is a cross-sectional view of the first exemplary semiconductor structure of FIG. 5 after forming source/drain contact trenches to expose portions of the source/drain regions.

Referring to FIG. 6, source/drain contact trenches 48 that extend through the ILD layer 32 are formed on opposite sides of the functional gate structures (42, 44, 46, 28). Each source/drain contact trench 48 exposes a portion of one of the source/drain regions 30. The source/drain contact trenches 48 can be formed by applying a mask layer (not shown) over the ILD layer 32 and the functional gate structures (42, 44, 46, 28), and then lithographically patterning the mask layer to form openings therein. Each opening overlies a portion of one of the source/drain regions 30. The mask layer can be a photoresist layer or a photoresist layer in conjunction with hardmask layer(s). The pattern in the mask layer is transferred through the ILD layer 32 to form the source/drain contact trenches 48. In one embodiment of the present application, a RIE may be performed to remove exposed portions of the ILD layer 32 to expose portions of the source/drain regions 30 within the source/drain contact trenches 48. In one embodiment, the source/drain contact trenches 48 may have a lateral dimension of 18 nm. After forming the source/drain contact trenches 48, the remaining mask layer can be removed by oxygen-based plasma etching.

Figure 7:
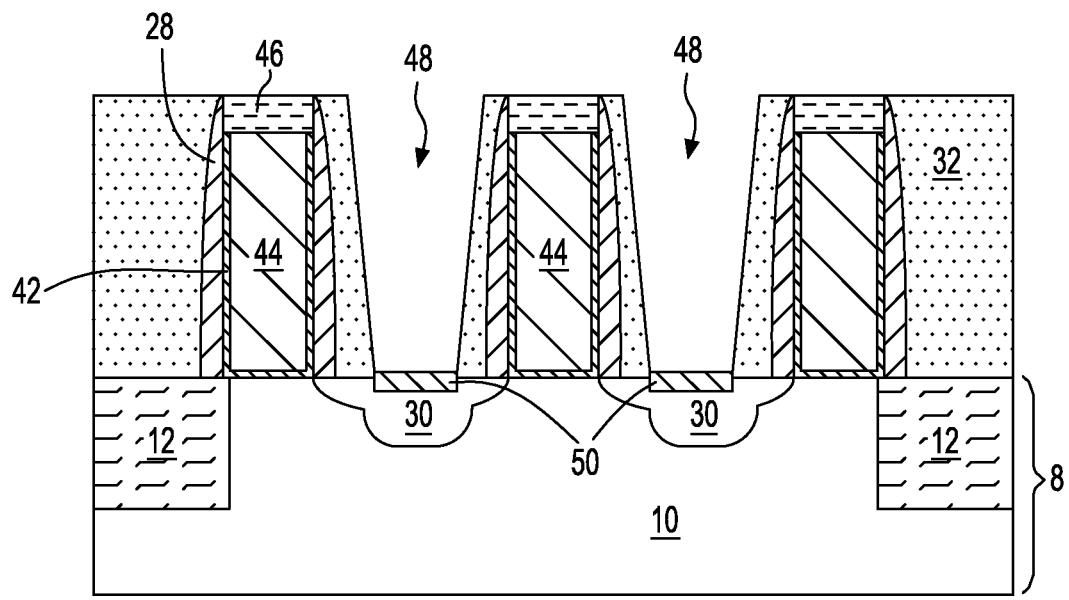
FIG. 7 is a cross-sectional view of the first exemplary semiconductor structure of FIG. 6 after forming a metal semiconductor alloy portion at a bottom of each of the source/drain contact trenches.

Referring to FIG. 7, a metal semiconductor alloy region 50 is formed at a bottom of each source/drain contact trench 48. The metal semiconductor alloy regions 50 may be composed of a silicide or germicide. In one embodiment, the metal semiconductor alloy regions 50 can be formed by first depositing a metal layer on the exposed portions of the source/drain regions 30, the sidewalls of the source/drain contact trenches 48, and top surfaces of the ILD layer 32 and the functional gate structures (42, 44, 46, 28). The metal layer may include a metal such as Ni, Co, Pt, W, Ti, Ta, a rare earth metal (e.g., Er, Yt, La), an alloy thereof, or any combination thereof. The metal layer may be deposited by CVD, PVD or ALD. The thickness of the metal layer can be from 2 nm to 10 nm, although lesser and grater thicknesses can also be employed.

An anneal is subsequently performed at an elevated temperature to induce reaction of the semiconductor material of the source/drain regions 30 and the metal in the metal layer to provide the metal semiconductor alloy regions 50. The unreacted portion of the metal layer is then removed, for example, by an etch, which can be a wet etch that removes the metal in the metal layer selective to the metal semiconductor alloy in the metal semiconductor alloy regions 50. The wet etch can be combined with a post-clean that removes any remnants of the metal layer from the exposed surfaces of the ILD layer 32 in the source/drain contact trenches 48.

Figure 8:
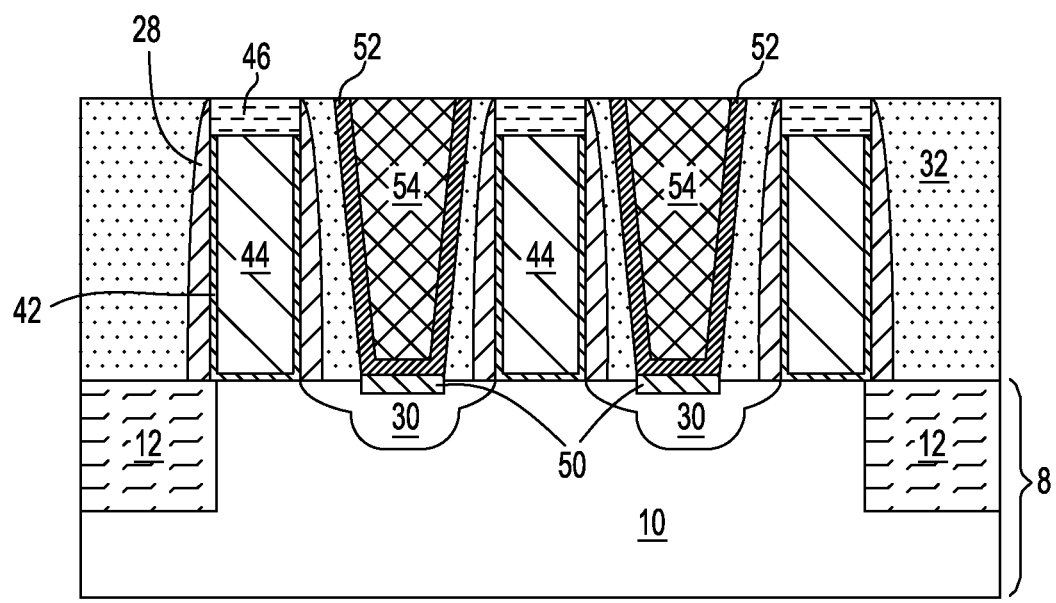
FIG. 8 is a cross-sectional view of the first exemplary semiconductor structure of FIG. 7 after forming a source/drain contact within each of the source/drain contact trenches.

Referring to FIG. 8, source/drain contacts are formed in the source/drain contact trenches 48 contacting the metal semiconductor alloy regions 50. A first contact liner layer (not shown) is deposited on sidewalls of the source/drain contact trenches 48 and top surfaces of the metal semiconductor alloy regions 50 and the ILD layer 32. The first contact liner layer may include Ti, TiN, Ta, TaN, Ni, Pt, Co, Ru, Pd, Er, Hf, La, or their alloys and may be formed utilizing a conformal deposition process including CVD or ALD. The first contact liner layer that is formed can have a thickness ranging from 1 nm to 5 nm, although lesser and greater thicknesses can also be employed.

A first conductive material layer (not shown) is deposited on the first contact liner layer to completely fill the source/drain contact trenches 48. The first conductive material layer may include a metal such as, for example, W, Al, Cu, or their alloys. The first conductive material layer can be formed by any suitable deposition method such as, for example, CVD, PVD or plating.

Portions of the first contact liner layer and the first conductive material layer that are located above the top surface of the ILD layer 32 can be subsequently removed by employing a planarization process, such as, for example, CMP. Remaining portions of the first contact liner layer within the source/drain contact trenches 48 constitute first contact liners 52, while remaining portions of the first conductive material layer within the source/drain contact trenches 48 constitute first conductive material portions 54. A first contact liner 52 and an overlying first conductive material portion 54 in each source/drain contact trench 48 together define a source/drain contact. The source/drain contact (452, 54) is in direct contact with a metal semiconductor alloy region 50 present at the bottom of each source/drain contact trench 48.

Figure 9:
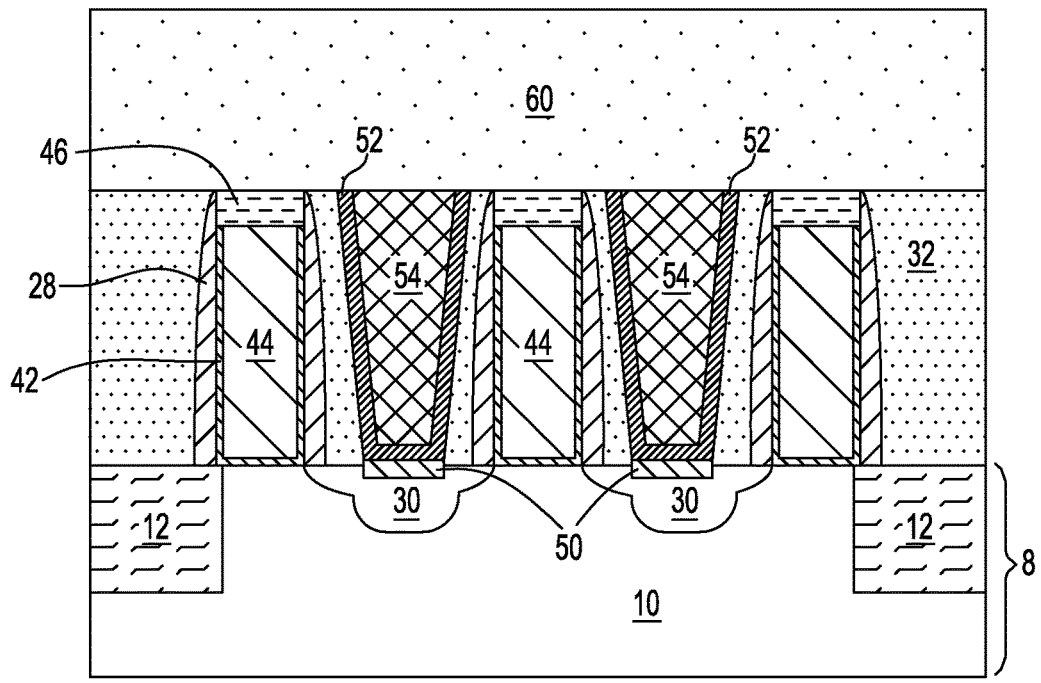
FIG. 9 is a cross-sectional view of the first exemplary semiconductor structure of FIG. 8 after forming a contact level dielectric layer over the functional gate structures, the source/drain contacts and the ILD layer.

Referring to FIG. 9, a contact level dielectric layer 60 is deposited over the ILD layer 32, the functional gate structures (42, 44, 46, 28) and the source/drain contacts (52, 54).

The contact level dielectric layer 60 can include a dielectric material such as undoped silicon oxide, doped silicon oxide, porous or non-porous organosilicate glass, porous or non-porous nitrogen-doped organosilicate glass, or a combination thereof. The contact level dielectric layer 60 may include a dielectric material the same as, or different from, the dielectric material of the ILD layer 32. The contact level dielectric layer 60 can be formed by CVD, PVD or spin coating. If the contact level dielectric layer 60 is not self-planarizing, the top surface of the contact level dielectric layer 60 can be planarized, for example, by CMP. The planarized top surface of the contact level dielectric layer 60 is located above the top surface of the ILD layer 32. In one embodiment, the contact level dielectric layer 60 may have a thickness of 80 nm.

Figure 10:
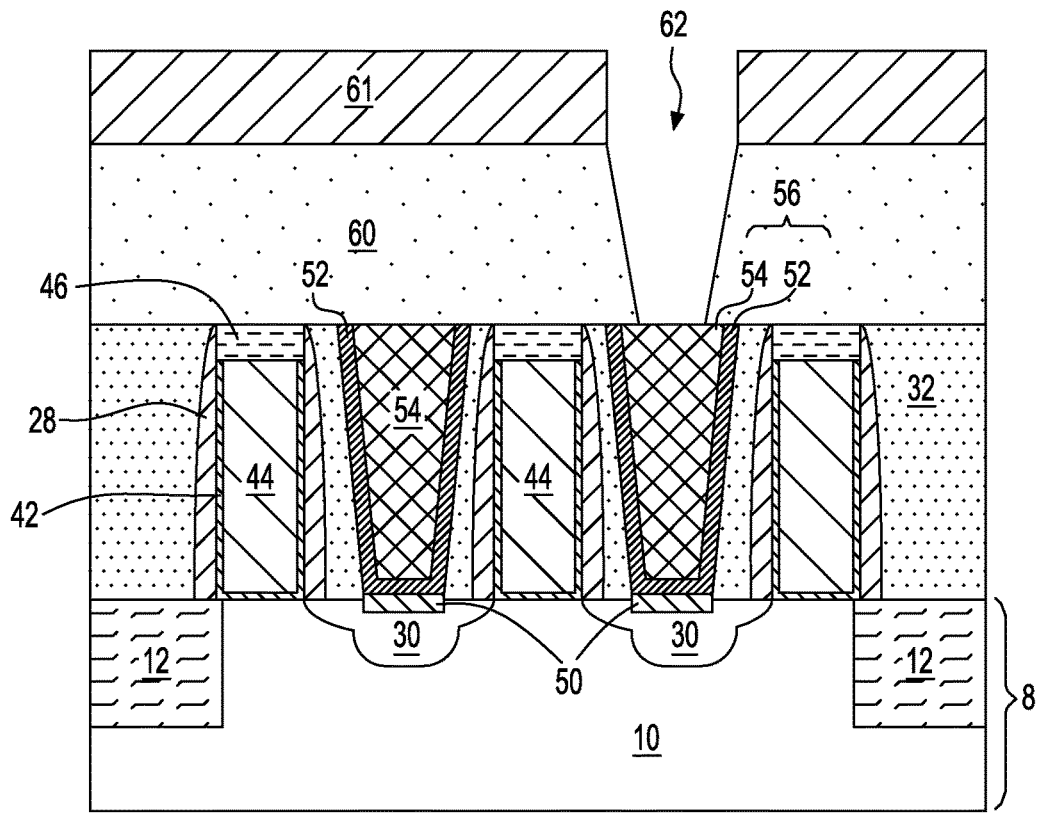
FIG. 10 is a cross-sectional view of the first exemplary semiconductor structure of FIG. 9 after forming a first contact opening to expose a portion of a first-side source/drain contact located at a first side of a target functional gate structure.

Referring to FIG. 10, a first contact opening 62 is formed extending through the contact level dielectric layer 60. The first contact opening 62 is also referred to as a CA contact opening within which a CA contact (i.e. source/drain contact) is later formed. The first contact opening 62 exposes a portion of one of source/drain contacts (52, 54) (herein referred to as a first-side source/drain contact 56) that is located on a first side of one of the functional gate structures (42, 44, 46) (herein referred to as a target functional gate structure). In one embodiment, the first contact opening 62 has a critical dimension of 18 nm. The first contact opening 62 can be formed by applying a mask layer (not shown) over the contact level dielectric layer 60, and then lithographically patterning the mask layer to form an opening therein. The opening overlies a portion of the first-side source/drain contact 56. The mask layer can be a photoresist layer or a photoresist layer in conjunction with hardmask layer(s). The remaining mask layer is herein referred to as a patterned mask layer 61. The pattern in the mask layer is transferred through the contact level dielectric layer 60 by an anisotropic etch which can be a dry etch or a wet chemical etch to form the first contact opening 62. In one embodiment, the first contact opening 62 can be formed by RIE that removes the dielectric material of the contact level dielectric layer 60 selective to the conductive material of the first conductive material portion 54. After forming the first contact opening 62, the patterned mask layer 61 can be removed by oxygen-based plasma etching.

Figure 11:
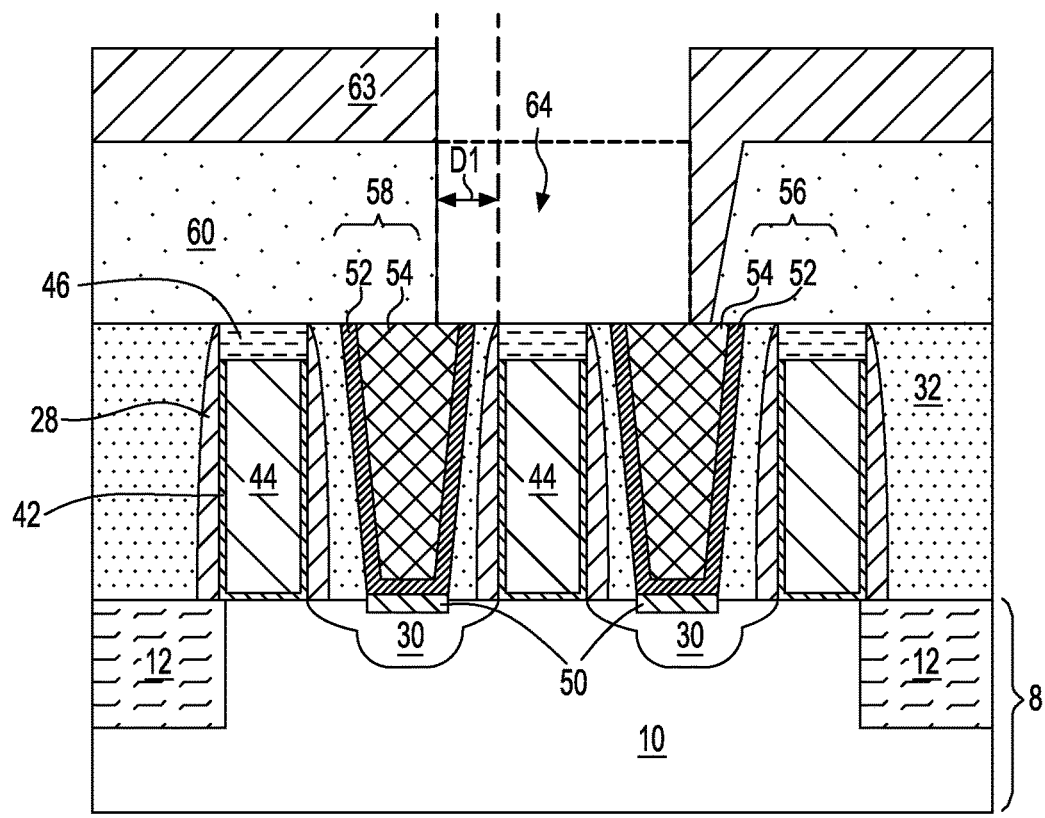
FIG. 11 is a cross-sectional view of the first exemplary semiconductor structure of FIG. 10 after forming a second contact opening that intersects the first contact opening to expose the target functional gate structure and a portion of a second-side source/drain contact located at a second side of the target functional gate structure.

Referring to FIG. 11, a second contact opening 64 is formed extending through the contact level dielectric layer 60 to expose an entirety of the target functional gate structure (42, 44, 46, 28). The second contact opening 64 intersects the first contact opening 62. The second contact opening 64 is also referred to as a CB contact opening within which a CB contact (i.e. gate contact) is later formed. The second contact opening 64 can be formed by performing processing steps of FIG. 10. For example, another mask layer (not shown) is applied over the contact level dielectric layer 60 and within the first contact opening 62, and then lithographically patterned to form an opening therein. The opening overlies the target functional gate structure (42, 44, 46, 28) and the first contact opening 62. The remaining portion of another mask layer is herein referred to as a patterned another mask layer 63. The pattern in the another mask layer is transferred through the contact level dielectric layer 60 by an anisotropic etch to form the second contact opening 62. In embodiment, after forming the second contact opening 64, the patterned another mask layer 63 can be removed by oxygen-based plasma etching.

Due to the lithographic misalignment during the formation of the second contact opening 64, a sidewall of the second contact opening 64 extends beyond the edge of the target functional gate stack (42, 44, 46) by a lateral distance D1. Thus, the second contact opening 64 also exposes a portion of another source/drain contact (52, 54) (herein referred to as a second-side source/drain contact 58) that is located on a second-side of the target functional gate structure (42, 44, 46, 28). The lateral distance D1 can be from 0 nm to 12 nm. In one embodiment and as shown in FIG. 11, the lateral distance D1 is less than 10 nm.

Figure 12:
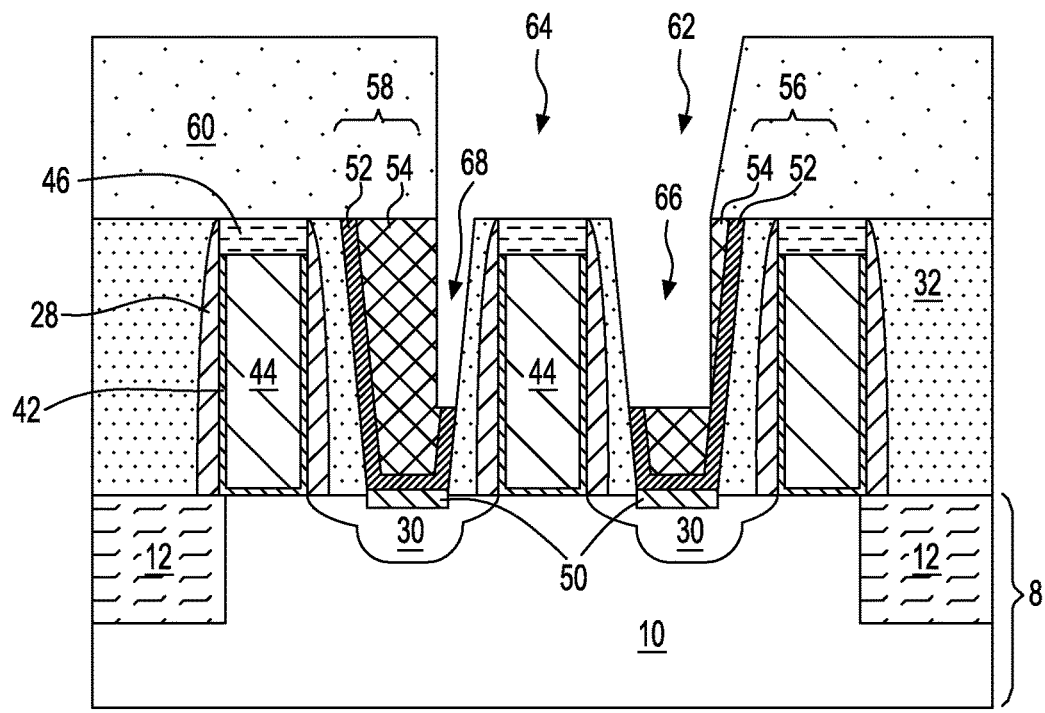
FIG. 12 is a cross-sectional view of the first exemplary semiconductor structure of FIG. 11 after recessing portions of the first-side source/drain contact and the second-side source/drain contact exposed by the first contact opening and the second contact opening to provide a first void above a recessed portion of the first-side source/drain contact and a second void above a recessed portion of the second-side source/drain contact.

Referring to FIG. 12, portions of the first-side source/drain contact 56 and the second-side source/drain contact 58 that are exposed by the first and the second contact openings 62, 64 are recessed relative to the top surface of the gate conductor 44 of the target functional gate structure (42, 44, 46, 48) by a recess etch. The recess etch removes conducive materials of the first contact liners 52 and the first conductive material portions 54 selective to the dielectric materials of the ILD layer 32, the gate cap 46, the gate spacers 28 and the contact level dielectric layer 60. The recess etch may be a dry etch, a wet chemical etch, or a combination thereof. In one embodiment and when the contact liner 52 is composed of TiN and the conductive material portion 54 is composed of W, the exposed portions of the contact liners 52 may be recessed by a wet chemical etch using an alkaline solution (SC-1) including an aqueous mixture of ammonium hydroxide and hydrogen peroxide (e.g., 1:1:5 of 30% $H_2O_2$, 28% $NH_4OH$ and $H_2O$), while the exposed portions of conductive material portions 54 may be recessed by RIE using a mixture of $SF_6$, nitrogen and chlorine as an etchant. After etching, the top surface of each recessed portion of the first-side source/drain contact 56 and the second-side source/drain contact 58 is located below the top surface of the gate conductor 44 of the target functional gate structure (42, 44, 46, 48). The recess etch provides a first void 66 above the recessed portion of the first-side source/drain contact 56 and a second void 68 above the recessed portion of the second-side source/drain contact 58. The first void 66 has a lateral dimension greater than the lateral dimension of the second void 168.

Figure 13:
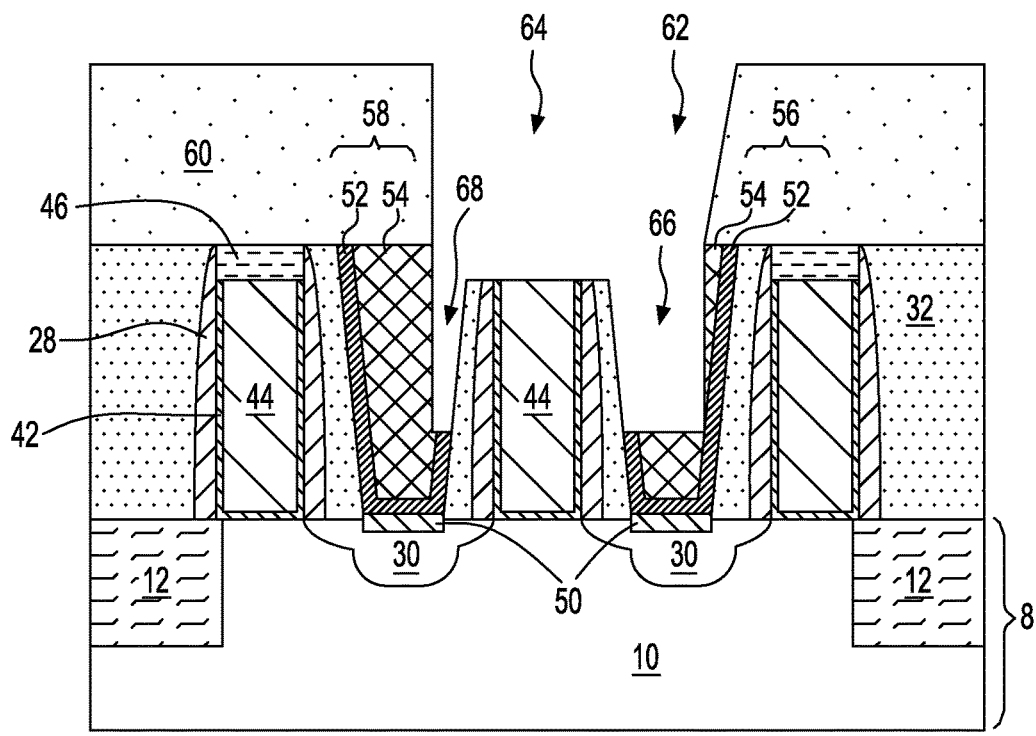
FIG. 13 is a cross-sectional view of the first exemplary semiconductor structure of FIG. 12 after removing a gate cap from the target functional gate structure.

Referring to FIG. 13, the gate cap 46 of the target functional gate structure (42, 44, 46, 28) is removed by CMP or a recess etch employing the top surface of the gate conductor 44 as an etch stop. The top surface of the gate conductor 44 of the target functional gate structure (42, 44, 46) is thus exposed within the second contact opening 64. In one embodiment and as shown in FIG. 13, portions of the gate spacers 28 and the ILD layer 32 that are exposed by the first and the second contact openings 62, 64 may also be removed by the CMP or the recess etch that is employ to remove the gate cap 46.

Figure 14:
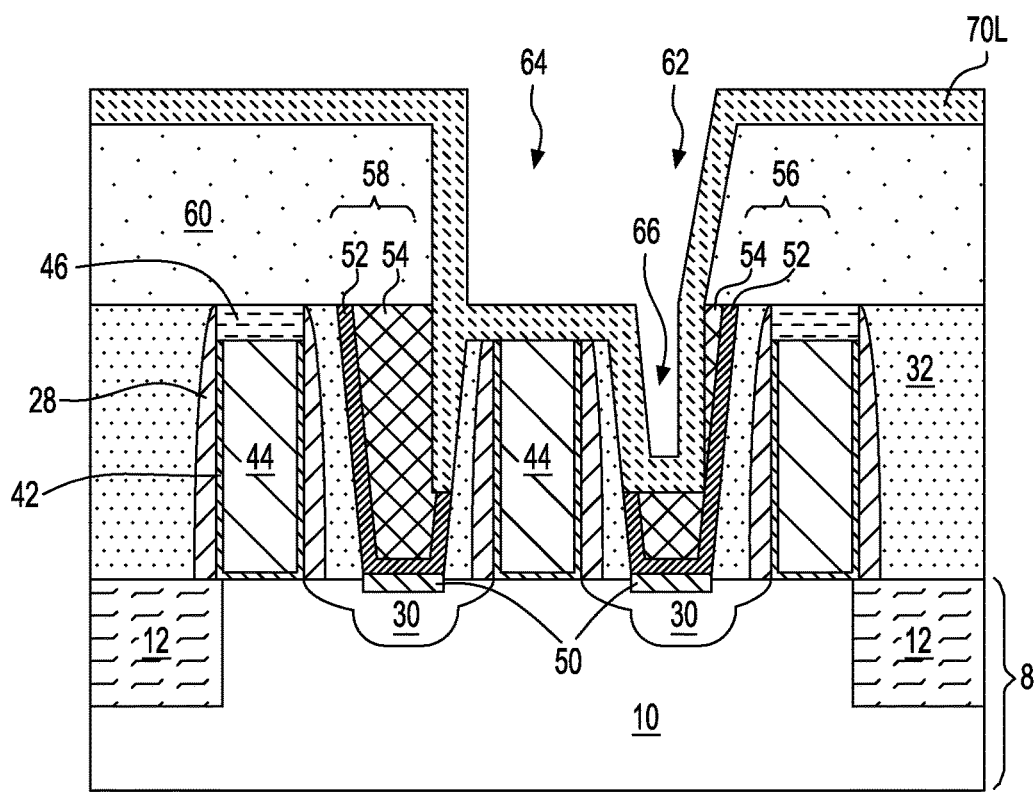
FIG. 14 is a cross-sectional view of the first exemplary semiconductor structure of FIG. 13 after conformally depositing a dielectric fill material layer on sidewalls and bottom surfaces of the first contact opening, the second contact opening, the first void and the second void.

Referring to FIG. 14, a dielectric fill material layer 70L is deposited to fill the second void 68. The dielectric fill material layer 70L is formed as a single contiguous layer. The dielectric fill material layer 70L may include silicon nitride and may be deposited, for example, by CVD or ALD. The deposition conditions are selected so as to result in a layer thickness that is sufficient to completely fill the second void 68. In one embodiment and as shown in FIG. 14, the first void 66 is only partially filled by the dielectric fill material layer 70L due to the greater lateral dimension of the first void 66.

Figure 15:
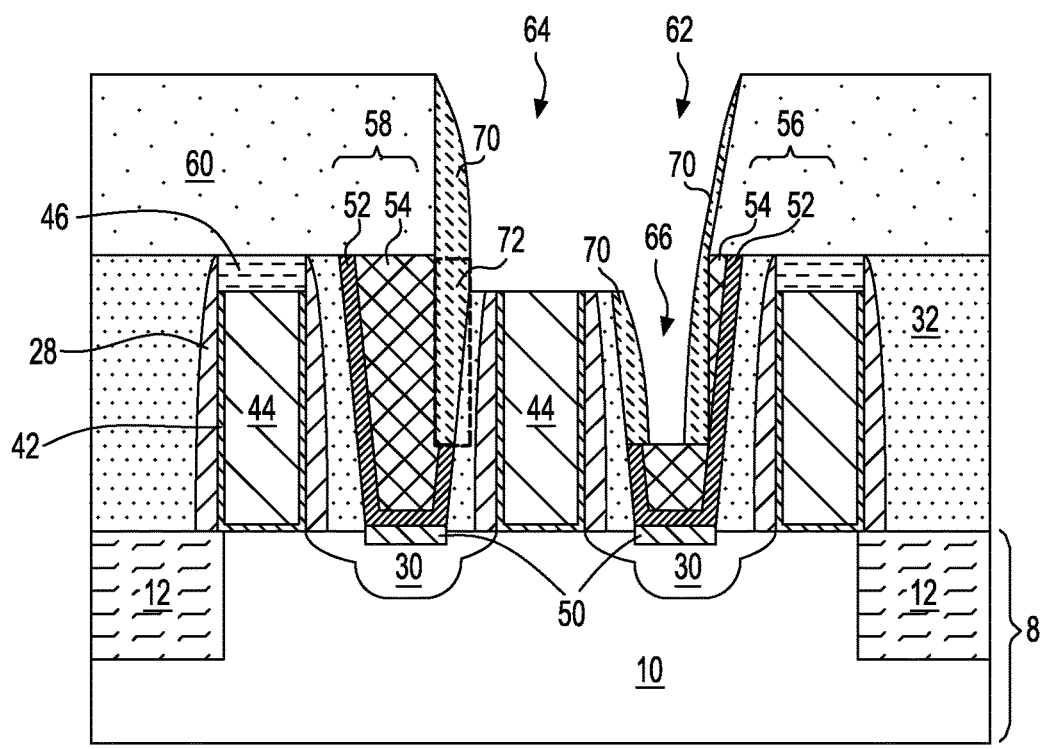
FIG. 15 is a cross-sectional view of the first exemplary semiconductor structure of FIG. 14 after forming a dielectric cap in the second void and dielectric spacers on sidewalls of the first contact opening, the second contact opening and the first void.

Referring to FIG. 15, the dielectric fill material layer 70L is etched by a conventional directional etch to remove the horizontal portions of the dielectric fill material layer 70L to form dielectric spacers 70 on sidewalls of the first contact opening 62, the second contact opening 64 and the first void 66. The portion of the dielectric fill material layer 70L that is located within the second void 68 is herein referred to as a dielectric cap 72. A portion of the top surface of the recess portion of the first-side source/drain contact 56 is exposed at the bottom of the first void 66, while an entire top surface of the gate conductor 44 located between the first-side and the second side source/drain contacts 56, 58 is exposed at the bottom of the second contact opening 64.

Figure 16:
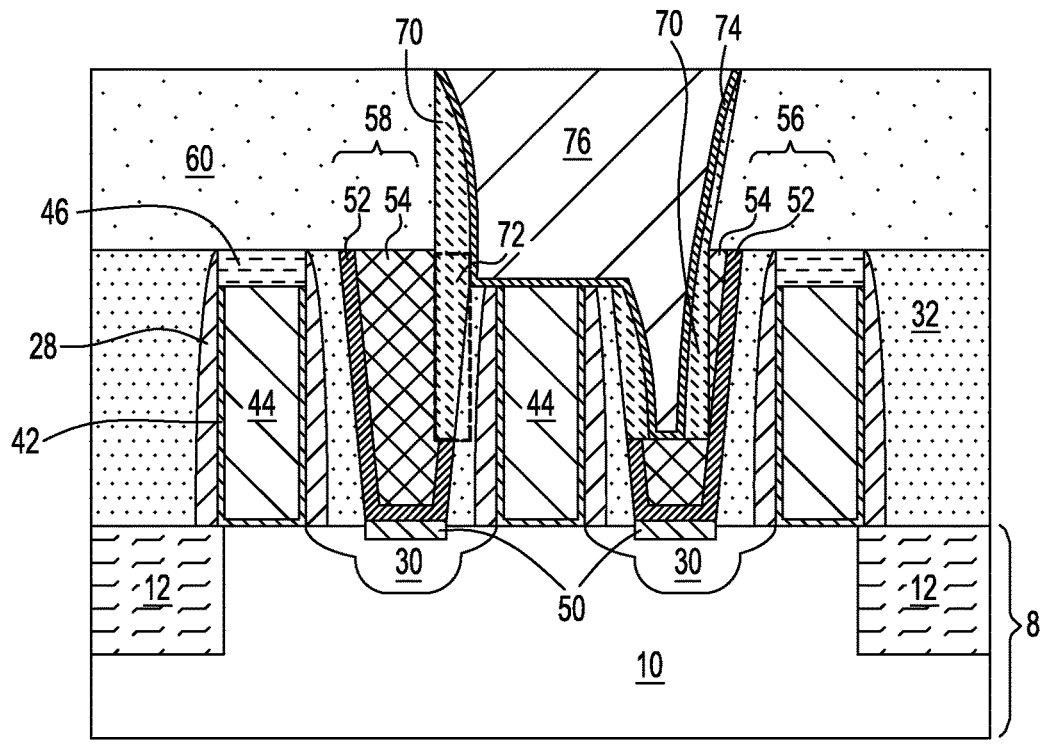
FIG. 16 is a cross-sectional view of the first exemplary semiconductor structure of FIG. 15 after forming a shared contact in the first contact opening, the second contact opening and the first void.

Referring to FIG. 16, a shared contact is formed in the first contact opening 62, the second contact opening 66 and the first void 66. The shared contact is in direct contact with the top surface of the recessed portion of the first-side source/drain contact 56 and the gate conductor 44 of the target functional gate structure (42, 44, 46, 28). The shared contact may include a second contact liner 74 present on the sidewalls of the dielectric spacers 70 and the bottom surfaces of the second contact opening 64 and the first void 66 and a second conductive material portion 76 overlying the second contact liner 74. The second conductive material portion 76 completely fills the remaining volumes of the first contact opening 62, the second contact opening 64 and the first void 66. The second contact liner 74 may include a metal that is the same as, or different from, the metal of the first contact liner 52. The second conductive material portion 76 may include a conductive material that is the same as, or different from, the conductive material of the first conductive material portion 54. The processing techniques and thickness ranges described above for the first contact liner 52 and the first conductive material portion 54 are also applicable here for the formation of the second contact liner 74 and the second conductive material portion 76. The shared contact (74, 76) is a dual contact electrically connecting the first-side source/drain contact 56 to the gate conductor 44 of the target functional gate structure (42, 44, 46, 28). The dielectric cap 72 that is located on the recessed portion of the second-side source/drain contact 58 isolates the shared contact (72, 74) from the second-side source/drain contact 58, thus effectively preventing the shorts of the shared contact (72, 74) and the second-side source/drain contact 58.

Figure 17:
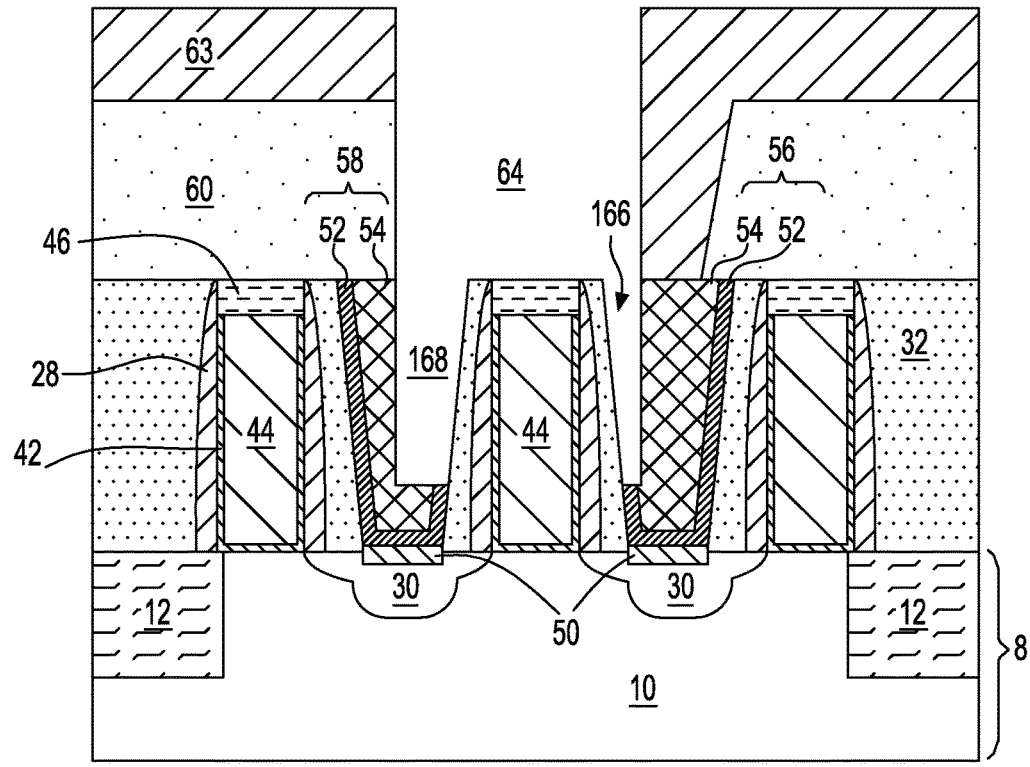
FIG. 17 is a cross-sectional view of a second exemplary semiconductor structure that can be derived from the first exemplary semiconductor structure of FIG. 11 according to a second embodiment of the present application after recessing portions of the first-side source/drain contact and the second-side source/drain contact exposed by the second contact opening to provide a first void above a recessed portion of the first-side source/drain contact and a second void above a recessed portion of the second-side source/drain contact.

Referring to FIG. 17, a second exemplary semiconductor structure according to a second embodiment can be derived from the first exemplary semiconductor structure of FIG. 11 by only recessing portions of the first-side source/drain contact 56 and the second-side source/drain contact 58 that are exposed by the second contact opening 62, 64 in the instance where the greater extent of the lithographic misalignment results in a larger lateral distance D1 between the sidewall of the second contact opening 64 and the edge of the functional gate stack (42, 44, 46) in the target functional gate structure (42, 44, 46, 28). In one embodiment, the lateral distance D1 is around 20 nm. In the second embodiment, before removing the patterned another mask layer 63 from the first contact opening 62, the processing steps of FIG. 13 can be performed to recess the first-side and the second-side source/drain contacts 56, 58 that are exposed by the second contact opening 64 to provide a first void 166 above the recessed portion of the first-side source/drain contact 56 and a second void 168 above the second-side source/drain contact 58. In the second embodiment, the first void 166 has a lateral dimension smaller than that of the first void 168. After the recess etch, the patterned another mask layer 63 can be removed by oxygen-based plasma etching.

Figure 18:
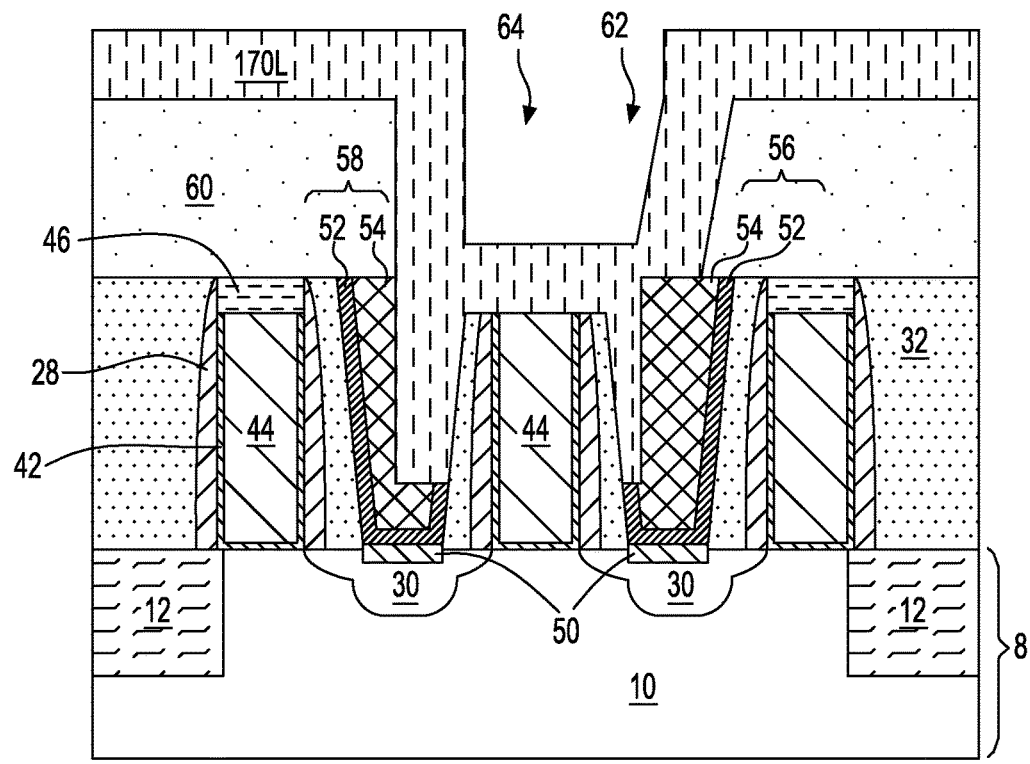
FIG. 18 is a cross-sectional view of the second exemplary semiconductor structure of FIG. 17 after conformally depositing a dielectric fill material layer on sidewalls and bottom surfaces of the first contact opening, the second contact opening, the first void and the second void.

Referring to FIG. 18, the processing steps of FIG. 14 are performed to form a dielectric fill material layer 170L on exposed surfaces of the contact level dielectric layer 60, the first contact opening 62, the second contact opening 64, the first void 166 and the second void 168. The dielectric fill material layer 170L is deposited to a thickness to completely fill the first and the second voids 166, 168.

Figure 19:
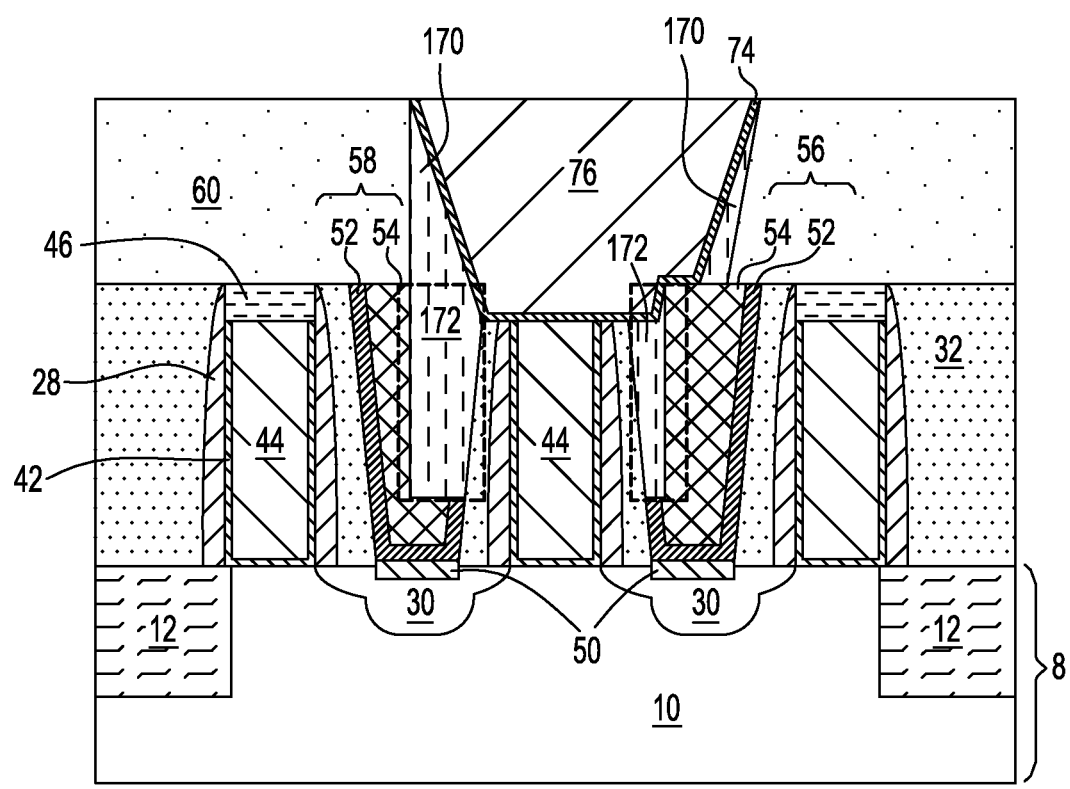
FIG. 19 is a cross-sectional view of the first exemplary semiconductor structure of FIG. 14 after forming dielectric caps in the first void and the second void and dielectric spacers on sidewalls of the first contact opening and the second contact opening followed by forming a shared contact in the first contact opening and the second contact opening.

Referring to FIG. 19, processing steps of FIG. 15 are performed to form dielectric caps 172 within the first and the second voids 166, 168 and dielectric spacers 170 on sidewalls of the first and the second contact openings 62, 64. The dielectric caps 172 completely fills the first and the second voids 166, 168.

Subsequently, the processing steps of FIG. 16 are performed to form a shared contact including a second contact liner 74 and a second conductive material portion 76 within the first and the second contact openings 62, 64. The shared contact (74, 76) in the second embodiment of present application thus is in direct contact with the top surface of the unrecessed portion of the first-side source/drain contact 56 and an entire top surface of the gate conductor 44 of the target functional gate structure (42, 44, 46, 28).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a functional gate structure located over a semiconductor material layer and laterally surrounded by an interlevel dielectric (ILD) layer;
a first source/drain region located at a first side of the functional gate structure and a second source/drain region located at a second side of the functional gate structure opposite the first side;
a first source/drain contact and a second source/drain contact embedded within the ILD layer, the first source/drain contact overlying and contacting a portion of the first source/drain region and having a recessed portion proximal to the first side of the functional gate structure, the second source/drain contact overlying and contacting a portion of the second source/drain region and having a recessed portion proximal to the second side of the functional gate structure;
a shared contact contacting an entire top surface of a gate conductor of the functional gate structure and a portion of the first source/drain contact; and
a dielectric cap present over the recessed portion of the second source/drain contact, the dielectric cap contacting a sidewall of the shared contact and isolating the second source/drain contact from the shared contact.

2. The semiconductor structure of claim 1, wherein a top surface of the recessed portion of each of the first source/drain contact and the second source/drain contact is located below the top surface of the gate conductor.

3. The semiconductor structure of claim 2, wherein the shared contact is in direct contact with the top surface of the gate conductor and the top surface of the recessed portion of first source/drain contact.

4. The semiconductor structure of claim 3, wherein a portion of the shared contact is laterally surrounded by a dielectric spacer present on the top surface of the recessed portion of first source/drain contact.

5. The semiconductor structure of claim 4, wherein the dielectric cap and the dielectric spacer comprise a same dielectric material.

6. The semiconductor structure of claim 1, wherein the shared contact is embedded within a contact level dielectric layer overlying the ILD layer.

7. The semiconductor structure of claim 1, further comprising a first metal semiconductor alloy portion located between the first source/drain contact and the first source/drain region and a second metal semiconductor alloy portion located between the second source/drain contact and the second source/drain region.

8. The semiconductor of claim 1, wherein each of the first source/drain contact, the second source/drain contact and the shared contact includes a stack of, from bottom to top, a contact liner and a conductive material portion surrounded by the contact liner.

9. The semiconductor structure of claim 2, further comprising another dielectric cap present over the recessed portion of the first source/drain contact.

10. The semiconductor structure of claim 9, wherein the shared contact is in direct contact with the top surface of the gate conductor, a top surface of the another dielectric cap and a top surface of an unrecessed portion of the first source/drain contact.

11. The semiconductor structure of claim 9, wherein the another dielectric cap laterally contacts a sidewall of an unrecessed portion of the first source/drain contact.

12. The semiconductor structure of claim 9, wherein the dielectric cap has a lateral dimension greater than the another dielectric cap.

13. The semiconductor structure of claim 10, wherein a portion of the shared contact is laterally surrounded by a dielectric spacer present on the top surface of the dielectric cap and another dielectric spacer present on the top surface of the unrecessed portion of the first source/drain contact.

14. The semiconductor structure of claim 1, wherein the functional gate structure further comprises a gate dielectric surrounding the gate conductor, and a gate spacer present on vertical portions of the gate dielectric.

15. The semiconductor structure of claim 1, wherein a top surface of an unrecessed portion of each of the first source/drain contact and the second source/drain contact is coplanar with a top surface of the ILD layer.

16. The semiconductor structure of claim 8, wherein the contact liner comprises Ti, TiN, Ta, TaN, Ni, Pt, Co, Ru, Pd, Er, Hf, La, or an alloy thereof, and the conductive material portion comprises W, Al, Cu, or an alloy thereof.

17. The semiconductor structure of claim 1, wherein the dielectric cap laterally contacts a sidewall of an unrecessed portion of the second source/drain contact.

* * * * *